US009512979B2

(12) United States Patent
Hirosaki et al.

(10) Patent No.: US 9,512,979 B2
(45) Date of Patent: Dec. 6, 2016

(54) PHOSPHOR, PRODUCTION METHOD FOR THE SAME, AND LIGHT-EMITTING DEVICE

(75) Inventors: Naoto Hirosaki, Tsukuba (JP); Ryo Yoshimatsu, Tokyo (JP); Shintaro Watanabe, Tokyo (JP)

(73) Assignees: DENKA COMPANY LIMITED, Tokyo (JP); NATIONAL INSTITUTE FOR MATERIALS SCIENCE, Ibaraki (JP)

( * ) Notice: Subject to any disclaimer, the term of this patent is extended or adjusted under 35 U.S.C. 154(b) by 119 days.

(21) Appl. No.: 13/983,748

(22) PCT Filed: Feb. 3, 2012

(86) PCT No.: PCT/JP2012/052493
§ 371 (c)(1),
(2), (4) Date: Oct. 15, 2013

(87) PCT Pub. No.: WO2012/105687
PCT Pub. Date: Aug. 9, 2012

(65) Prior Publication Data
US 2014/0307415 A1 Oct. 16, 2014

(30) Foreign Application Priority Data
Feb. 6, 2011 (JP) .................... 2011-023434

(51) Int. Cl.
*C09K 11/64* (2006.01)
*C09K 11/08* (2006.01)
(Continued)

(52) U.S. Cl.
CPC ............. *F21V 9/16* (2013.01); *C09K 11/0883* (2013.01); *C09K 11/7734* (2013.01); *G02F 1/133602* (2013.01); *H01L 33/502* (2013.01)

(58) Field of Classification Search
CPC .......... C09K 11/0883; C09K 11/7734; H01L 33/502; H01L 33/504; G02F 1/133602
See application file for complete search history.

(56) References Cited

U.S. PATENT DOCUMENTS 8,674,388 B2 * 3/2014 Shioi et al. ............. 257/98
2009/0236963 A1 * 9/2009 Nagatomi et al. ........ 313/483
(Continued)

FOREIGN PATENT DOCUMENTS

EP   1 867 697 A1   12/2007
JP   2006-213910 A   8/2006
(Continued)

OTHER PUBLICATIONS

European Search Report issued Oct. 2, 2014 for European Application No. 12742239.2-1355.*
(Continued)

*Primary Examiner* — Carol M Koslow
(74) *Attorney, Agent, or Firm* — Stein IP, LLC (57) ABSTRACT

A phosphor with a high light-emitting intensity, indicated by general formula $Me_aRe_bSi_cAl_d$—$N_eO_f$. In the formula: Me has Sr as an essential element thereof and can include one or more types of element selected from Na, Li, Mg, Ca, Ba, Sc, Y, and La; and Re has Eu as an essential element thereof and can include one or more types of element selected from Mn, Ce, Tb, Yb, and Sm. When $a=1-x$, $b=x$, $c=(2+2p)\times(1-y)$, $d=(2+2p)\times y$, $e=(1+4p)\times(1-z)$, and $f=(1+4p)\times z$, parameters, p, x, y, and z fulfill the following: $1.610<p<1.620$, $0.005<x<0.300$, $0.190<y<0.260$, and $0.060<z<0.120$. A light-emitting device with high luminance is provided by using this phosphor.

9 Claims, 8 Drawing Sheets

(51) Int. Cl.
*F21S 2/00* (2016.01)
*H01L 33/50* (2010.01)
*F21V 9/16* (2006.01)
*G02F 1/1335* (2006.01)
*C09K 11/77* (2006.01)

(56) References Cited

U.S. PATENT DOCUMENTS

| 2010/0025632 A1* | 2/2010 | Fukuda et al. ......... 252/301.6 R |
| 2010/0164367 A1* | 7/2010 | Shioi et al. .................. 313/503 |
| 2011/0309399 A1* | 12/2011 | Shinohara et al. ............. 257/98 |

FOREIGN PATENT DOCUMENTS

| JP | WO 2009/072043 | * | 6/2009 |
| JP | 2009-286995 A | | 12/2009 |
| JP | 2010-185009 A | | 8/2010 |
| JP | 2010-287908 | * | 12/2010 |
| JP | 2010-287908 A | | 12/2010 |
| JP | 2011-017007 A | | 1/2011 |
| JP | WO 2011/016486 | * | 2/2011 |
| WO | WO 2006/093298 A1 | | 9/2006 |
| WO | WO 2007/037059 A1 | | 4/2007 |
| WO | WO 2007/105631 A1 | | 9/2007 |
| WO | WO 2010/098141 A1 | | 9/2010 |

OTHER PUBLICATIONS

International Search Report mailed Feb. 28, 2012, issued in corresponding International Patent Application No. PCT/JP2012/052493. (included with a copy of the PCT application).
U.S. Appl. No. 13/983,756, filed Aug. 5, 2013, Naoto Hirosaki, et al., National Institute for Materials Science and Denki Kagaku Kogyo Kabushiki Kaisha.
U.S. Appl. No. 13/983,762, filed Aug. 5, 2013, Naoto Hirosaki, et al., National Institute for Materials Science and Denki Kagaku Kogyo Kabushiki Kaisha.
Kousuke Shioi et al., "Synthesis and photoluminescence of a novel Sr-SiAlON:$Eu^{2+}$ blue-green phosphor $(Sr_{14}Si_{68-s}Al_{6+s}O_sN_{110-s}:Eu^{2+}$ (s≈7))", Journal of Alloys and Compounds 509, (2011) pp. 332-3337.
Yuichi Michiue et al., "$Eu_3Si_{15-x}Al_{1+x}O_xN_{23-x}$ (X≃ 5/3) as a commensurate composite crystal", Acta Crystallographica, Section B Structural Science, pp. 567-575 2009.
Second Notification of Reasons for Refusal mailed Dec. 15, 2014, issued to Chinese Application No. 201280007856.0.

* cited by examiner

PHOSPHOR, PRODUCTION METHOD FOR THE SAME, AND LIGHT-EMITTING DEVICE

CROSS-REFERENCE TO RELATED APPLICATIONS

This application is a national stage application of PCT Application No. PCT/JP2012/052493, filed Feb. 3, 2012, which claims the benefit of Japanese Application No. 2011-023434, filed Feb. 6, 2011. All disclosures of the document(s) named above are incorporated herein by reference.

BACKGROUND OF THE INVENTION

1. Field of the Invention

The present invention relates to a phosphor that has composite oxynitride host crystal and emits light by being excited in a wavelength range from ultraviolet to blue light, a method for producing the same, and a light-emitting device using this phosphor.

2. Description of the Related Art

Instead of conventional sulfide- or oxide-based phosphors, such as silicate, phosphate, and aluminate phosphors, chemically stable nitride-based SiAlON phosphors, which are known as heat-resistant structural materials, have been proposed (Patent Literatures 1 to 3).

CITATION LIST

Patent Literature

Patent Literature 1: WO 2006093298
Patent Literature 2: WO 2007037059
Patent Literature 3: WO 2007/105631

Non-Patent Literature

Non-patent Literature 1: Acta Crystallographica Section B-Structural Science, vol. 65, 567-575, Part 5 (October 2009).

SUMMARY OF THE INVENTION

Technical Problem

The present invention provides a phosphor represented by general formula $Me_aRe_bSi_cAl_dN_eO_f$ (Me contains Sr as an essential element and may contain one or more elements selected from Na, Li, Mg, Ca, Ba, Sc, Y, and La; and Re contains Eu as an essential element and may contain one or more elements selected from Mn, Ce, Tb, Yb, and Sm), and when a, b, c, d, e, and f representing composition ratio satisfy the following formulae:
   $a=1-x$,
   $b=x$,
   $c=(2+2p) \times (1-y)$,
   $d=(2+2p) \times y$,
   $e=(1+4p) \times (1-z)$, and
   $f=(1+4p) \times z$,
parameters p, x, y, and z fall within the following range:
   $1.610 < p < 1.620$,
   $0.005 < x < 0.300$,
   $0.190 < y < 0.260$, and
   $0.060 < z < 0.120$.

It is desirable that c, d, e, and f representing composition ratio fall within the following range:
   $0.230 < d/c < 0.340$, and
   $0.060 < f/e < 0.200$.
Me desirably consists only of Sr.
Re desirably consists only of Eu.
p is desirably 1.615.

As such a phosphor, the one that is excited by light having wavelengths falling within a range from 300 nm to 500 nm and has emission peak wavelength falling within a range from 495 nm to 530 nm is desirable.

The phosphor is described by a crystal structure model represented as $(Me_{1-x}Re_xM_2X)_m(M_2X_4)_n$.

In the above formula, it is desirable that m and n be integers satisfying the relation $1.610 < n/m < 1.620$; Me contain Sr as an essential element and may contain one or more elements selected from Na, Li, Mg, Ca, Ba, Sc, Y, and La; Re contain Eu as an essential element and may contain one or more elements selected from Mn, Ce, Tb, Yb, and Sm; M is one or more elements selected from Si, Ge, Al, and Ga; and X is one or more elements selected from O and N.

It is desirable that the phosphor is described by a crystal structure model containing structures represented as $(Me_{1-x}Re_xM_2X)$ of a quantity of m, and structures represented as $(M_2X_4)$ of a quantity of n in crystal unit cell.

The present invention, from another viewpoint, provides a method for producing the phosphor, including: a mixing process for mixing raw materials; and a burning process for burning a mixture having undergone the mixing process, wherein the raw materials are
(1) one or more compounds selected from nitrides, carbides, hydrides, silicides, carbonates, and oxides of Me (Me contains Sr as an essential element, and may contain one or more elements selected from Na, Li, Mg, Ca, Ba, Sc, Y, and La),
(2) one or more compounds selected from nitrides, hydrides, carbides, halides, and oxides of Re (Re contains Eu as an essential element, and may contain one or more elements selected from Mn, Ce, Tb, Yb, and Sm),
(3) one or more compounds selected from silicon nitride, silicon oxide, silicon oxynitride, and silicon metal, and
(4) one or more compounds selected from aluminum nitride, aluminum oxide, aluminum oxynitride, and aluminum metal.

In the burning process of the method for producing the phosphor, burning is desirably performed under the ambient pressure of 0.1 MPa or higher and at temperatures falling within a range from 1600° C. to 2000° C.

It is desirable that the method for producing the phosphor be provided with an annealing process where the phosphor having undergone the burning process is annealed at temperatures falling within a range from 1200° C. to 1900° C.

It is desirable that the raw materials used in the mixing process contain the phosphor obtained in the burning process.

The present invention from yet another viewpoint provides a light-emitting device that includes a light-emitting element and the phosphor.

The light-emitting device may use, in addition to the phosphor, one or more phosphors having emission peak wavelengths longer than that of the phosphor.

The light-emitting element is preferably an inorganic or organic light-emitting element that emits light having wavelengths falling within a range from 340 nm to 500 nm.

The light-emitting element is desirably an LED.

The light-emitting device is desirably a backlight for LC TVs, light-source device for projectors, lighting system, or signaling device.

Advantageous Effect of Invention

The phosphor according to the present invention provides higher brightness than conventional phosphors. According to the method for producing the phosphor of the present invention, a phosphor having higher brightness than conventional phosphors can be generated. The light-emitting device of the present invention is a light-emitting device providing higher brightness.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EMBODIMENTS

Reference will now be made in detail to the present embodiments of the present invention, examples of which are illustrated in the accompanying drawings, wherein like reference numerals refer to the like elements throughout. The embodiments are described below in order to explain the present invention by referring to the figures.

The present invention provides a phosphor represented by general formula $Me_aRe_bSi_cAl_dN_eO_f$ (Me contains Sr as an essential element and may contain one or more elements selected from Na, Li, Mg, Ca, Ba, Sc, Y, and La; and Re contains Eu as an essential element and may contain one or more elements selected from Mn, Ce, Tb, Yb, and Sm), and when a, b, c, d, e, and f representing composition ratio satisfy the following formulae:

$a = 1-x$,
$b = x$,
$c = (2+2p) \times (1-y)$,
$d = (2+2p) \times y$,
$e = (1+4p) \times (1-z)$, and
$f = (1+4p) \times z$, parameters p, x, y, and z fall within the following range:
$1.610 < p < 1.620$,
$0.005 < x < 0.300$,
$0.190 < y < 0.260$, and
$0.060 < z < 0.120$.

In this case, a, b, c, d, e, and f showing composition ratio represent the ratio of elements, and the values obtained by multiplying a, b, c, d, e, and f by an arbitrary positive numerical value give the same composition formula. Since standardization has been made in the present invention so that $a+b=1$ is satisfied, whether a material expressed by a certain composition formula falls within the range of the present invention is judged by using the composition ratio represented by a, b, c, d, e, and f, which have been standardized so that $a+b=1$ is satisfied.

p satisfies $1.610 < p < 1.620$, desirably falls within the range $1.612 < p < 1.618$, and more desirably $p = 1.615$. If the value p is below 1.610, or exceeds 1.620, formation of a second phase other than the desired composition will be promoted, thereby degrading color purity, or decreasing emission intensity.

It is desirable that c, d, e, and f representing composition ratio fall within the following range:
$0.230 < d/c < 0.340$, and
$0.060 < f/e < 0.200$.

In the phosphor according to the embodiment of the present invention, x represents atomic ratio of the light-emitting ions of Re. If the ratio of the light-emitting ions is small, sufficient emission intensity cannot be obtained. Meanwhile, if the ratio of light-emitting ions is large, a phenomenon referred to as concentration quenching, namely excitation energy re-absorption effect between light-emitting ions placed adjacent to each other, occurs, thereby inhibiting sufficient emission intensity from being obtained. It is desirable that x fall within a range $0.005 < x < 0.300$, and more preferably $0.010 < x < 0.250$.

In the phosphor of the present invention, y represents the ratio between Si element and Al element, and z represents the ratio between N element and O element, in the crystal structure. By using this parameter y and p, as well as z and p, composition ratio expressed by c, d, e, and f in general formula is determined, and thus d/c and f/e are found. To maintain the electric charge in the crystal neutral, y and z retain the relation where the degree of freedom becomes 1. Consequently, if parameters p and y, or p and z, are given, all of c, d, e, and f representing the composition ratio can be designed. It is desirable that d/c and f/e fall within the following range: $0.230 < d/c < 0.340$ and $0.060 < f/e < 0.200$. It is further desirable that $0.240 < d/c < 0.320$ and $0.070 < f/e < 0.190$ be satisfied. If d/c and f/e are below the lower limit values, formation of a second phase, other than the desired composition, is promoted, thereby degrading color purity or decreasing emission intensity.

As designed composition to maintain neutrality of electric charge, y and z are made to satisfy the following relation: $z = \{2y(p+1) + 4p - 7/(4p+1)\}$.

Me desirably consists only of Sr.
Re desirably consists only of Eu.
p is desirably 1.615.

The phosphor described above preferably emits fluorescence having emission peak wavelengths falling within the range from 495 nm to 530 nm by excitation light having wavelengths falling within the range from 300 nm to 500 nm.

The phosphor described above is defined by a crystal structure model represented as $(Me_{1-x}Re_xM_2X)_m(M_2X_4)_n$, where m and n are integers satisfying the relation $1.610 < n/m < 1.620$; Me contains Sr as an essential element and may contain one or more elements selected from Na, Li, Mg, Ca, Ba, Sc, Y, and La; Re contains Eu as an essential element and may contain one or more elements selected from Mn, Ce, Tb, Yb, and Sm; M is one or more elements selected from Si, Ge, Al, and Ga; and X is one or more elements selected from O and N. Note that $P = n/m$ is satisfied.

The phosphor is desirably described by a crystal structure model containing structures represented as $(Me_{1-x}Re_xM_2X)$ of a quantity of m, and structures represented as $(M_2X_4)$ of a quantity of n in crystal unit cell.

Since m and n respectively define the number of structures contained in the unit cell of the crystal model, the values determine the total number of unit cells. It is necessary in this crystal model that m and n are finite integers and that their combinations are satisfied. To obtain a desired phosphor, it is desirable that they fall within the following range: $1.610 < n/m < 1.620$.

A method for producing the phosphor according to the present invention will hereinafter be described.

The method for producing the phosphor according to the present invention includes: a mixing process for mixing raw materials; and a burning process for burning the mixture having undergone the mixing process, wherein the raw materials are:

(1) one or more compounds selected from nitrides, carbides, hydrides, silicides, carbonates, and oxides of Me (Me contains Sr as an essential element, and may contain one or more elements selected from Na, Li, Mg, Ca, Ba, Sc, Y, and La), (2) one or more compounds selected from nitrides, hydrides, carbides, halides, and oxides of Re (Re contains Eu as an essential element, and may contain one or more elements selected from Mn, Ce, Tb, Yb, and Sm), (3) one or more compounds selected from silicon nitride, silicon oxide, silicon oxynitride, and silicon metal, and (4) one or more compounds selected from aluminum nitride, aluminum oxide, aluminum oxynitride, and aluminum metal.

As a raw material, flux may be added to the raw materials listed above. As the flux, halides of alkali metals, halides of alkali earth metals, and halides of aluminum are available, and such flux is desirably added to the phosphor raw materials (100 wt %) by 0.01 to 20 wt %.

Me contains Sr as an essential element, and may contain one or more elements selected from Na, Li, Mg, Ca, Ba, Sc, Y, and La. Me may contain, in addition to Sr, one or more elements selected from Mg, Ca, and Ba, but the case where Me consists only of Sr is desirable.

Re contains Eu as an essential element, and may contain one or more elements selected from Mn, Ce, Tb, Yb, and Sm, but the case where Re consists only of Eu is desirable.

In the burning process of this method for producing the phosphor, it is desirable that burning is performed under the ambient pressure of 0.1 MPa or higher and at temperatures falling within a range from 1600° C. to 2000° C.

It is desirable that this method for producing the phosphor is provided with an annealing process in which the phosphor having undergone the burning process is annealed at temperatures falling within a range from 1200° C. to 1900° C.

It is desirable that the raw materials in the mixing process contain the phosphor obtained in the burning process described previously.

The present invention from yet another viewpoint provides a light-emitting device having a light-emitting element and the phosphor described previously.

The light-emitting device may use, in addition to the phosphor described previously, one or more phosphors having emission peak wavelengths longer than the wavelength of the phosphor described previously.

The phosphors having longer emission peak wavelengths than the fluorescence emitted by the phosphor described previously include β-SiAlON: Eu, YAG: Ce, α-SiAlON: Eu, $(Li,Ca)(Al,Si)_2(N,O)_3$: Ce, $(Ca,Sr,Ba)_2Si_5N_8$: Eu, $SrAlSi_4N_7$: Eu, and $(Ca,Sr)AlSiN_3$: Eu.

It is desirable that the light-emitting element is either inorganic or organic light-emitting element having emission wavelengths falling within a range from 340 nm to 500 nm.

The light-emitting element is desirably an LED.

It is desirable that the light-emitting device be a backlight for LC TVs, light-source system for projectors, lighting system, or signaling device.

The phosphor according to the embodiment of the present invention is characterized in that it is described by a crystal structure model represented as $(Me_{1-x}Re_xM_2X)_m(M_2X_4)_n$, where Me contains Sr as an essential element and may contain one or more elements selected from Na, Li, Mg, Ca, Ba, Sc, Y, and La; Re contains Eu as an essential element and may contain one or more elements selected from Mn, Ce, Tb, Yb, and Sm; M is one or more elements selected from Si, Ge, Al, and Ga; and X is one or more elements selected from O and N. Even phosphors that have the same element combination but that cannot be represented by the above structure model promotes formation of a second phase other than the desired composition, thus decreasing emission intensity.

The phosphor according to the embodiment of the present invention emits, unlike conventional phosphors, high-intensity blue-green to green fluorescence, which has emission peak wavelengths falling within the range from 495 nm to 530 nm by excitation light having wavelengths falling within the range from 300 nm to 500 nm, when emission originates from Eu ions, in particular.

Examples

Examples of the present invention will hereinafter be described in detail by referring to Comparative Examples.

The phosphors in Examples 1 to 3 will be described.

As powder raw materials, powder silicon nitride ($Si_3N_4$), powder aluminum nitride (AlN), aluminum oxide ($Al_2O_3$), powder strontium oxide (SrO), powder strontium nitride ($Sr_3N_2$), and powder europium oxide ($Eu_2O_3$) were used.

In general formula $Me_aRe_bSi_cAl_dN_eO_f$, p, x, y, z, a, b, d/c, and f/e were designed to be of compositions shown in Table 1.

Comparative Example 1 shown in Table 1 is a composition where p is below the lower limit value, and others satisfy the conditions of the present invention. p in Comparative Examples 2 to 4 is 1.615 (p=1.615) as in the case of Examples 1 to 3, falling within the conditions of the present invention, but d/c or f/e is below the lower limit. p in Comparative Examples 5 to 8 is 1.615 (p=1.615), but d/c or f/e exceeds the upper limit value.

TABLE 1

| | Designed composition | | | | | | | |
|---|---|---|---|---|---|---|---|---|
| | p | x | y | z | a | b | d/c | f/e |
| Com. Ex. 1 | 1.600 | 0.014 | 0.269 | 0.108 | 0.986 | 0.014 | 0.37 | 0.12 |
| Com. Ex. 2 | 1.615 | 0.013 | 0.103 | 0.000 | 0.987 | 0.013 | 0.11 | 0.00 |

TABLE 1-continued

| | Designed composition | | | | | | | |
|---|---|---|---|---|---|---|---|---|
| | p | x | y | z | a | b | d/c | f/e |
| Com. Ex. 3 | 1.615 | 0.013 | 0.132 | 0.021 | 0.987 | 0.013 | 0.15 | 0.02 |
| Com. Ex. 4 | 1.615 | 0.013 | 0.162 | 0.041 | 0.987 | 0.013 | 0.19 | 0.04 |
| Example 1 | 1.615 | 0.013 | 0.191 | 0.062 | 0.987 | 0.013 | 0.24 | 0.07 |
| Example 2 | 1.615 | 0.013 | 0.221 | 0.082 | 0.987 | 0.013 | 0.28 | 0.09 |
| Example 3 | 1.615 | 0.013 | 0.250 | 0.103 | 0.987 | 0.013 | 0.33 | 0.11 |
| Com. Ex. 5 | 1.615 | 0.013 | 0.279 | 0.124 | 0.987 | 0.013 | 0.39 | 0.14 |
| Com. Ex. 6 | 1.615 | 0.013 | 0.294 | 0.134 | 0.987 | 0.013 | 0.42 | 0.15 |
| Com. Ex. 7 | 1.615 | 0.013 | 0.324 | 0.155 | 0.987 | 0.013 | 0.48 | 0.18 |
| Com. Ex. 8 | 1.615 | 0.013 | 0.353 | 0.175 | 0.987 | 0.013 | 0.55 | 0.21 |

The powder raw materials designed as shown above were weighed in a glove box filled with inert gas at the mass ratio shown in Table 2, and mixed in dry state for 30 minutes using an agate mortar and a mortar. Me is made to consist only of Sr, and Re is made to consist only of Eu.

TABLE 2

| | Weight (g) | | | | | |
|---|---|---|---|---|---|---|
| | SrO | $Sr_3N_2$ | $Si_3N_4$ | AlN | $Al_2O_3$ | $Eu_2O_3$ |
| Com. Ex. 1 | 0.577 | 0.000 | 1.260 | 0.407 | 0.000 | 0.018 |
| Com. Ex. 2 | 0.000 | 0.564 | 1.293 | 0.130 | 0.000 | 0.014 |
| Com. Ex. 3 | 0.086 | 0.483 | 1.250 | 0.167 | 0.000 | 0.014 |
| Com. Ex. 4 | 0.180 | 0.395 | 1.207 | 0.204 | 0.000 | 0.014 |
| Example 1 | 0.273 | 0.307 | 1.164 | 0.241 | 0.000 | 0.014 |
| Example 2 | 0.367 | 0.219 | 1.121 | 0.278 | 0.000 | 0.014 |
| Example 3 | 0.461 | 0.132 | 1.079 | 0.315 | 0.000 | 0.014 |
| Com. Ex. 5 | 0.554 | 0.044 | 1.036 | 0.352 | 0.000 | 0.014 |
| Com. Ex. 6 | 0.601 | 0.000 | 1.015 | 0.371 | 0.000 | 0.014 |
| Com. Ex. 7 | 0.601 | 0.000 | 0.972 | 0.383 | 0.031 | 0.014 |
| Com. Ex. 8 | 0.600 | 0.000 | 0.929 | 0.395 | 0.061 | 0.014 |

The powder mixture obtained by dry mixing was then poured into a crucible made of boron nitride (BN).

The boron nitride crucible filled with the powder mixture was set in an electric furnace that used carbon fiber compact as an insulating material and adopted the graphite heater heating method.

Burning was performed as follows: the heated enclosure of the electric furnace was made to be vacuum using a diffusion pump first, and the temperature was increased from room temperature to 1000° C. at the rate of 20° C. minutes. When the temperature increased to 1000° C., the heated enclosure was filled with 1.0 MPa nitrogen gas, the temperature was increased to 1900° C. at the rate of 10° C./hour, and the temperature was maintained at 1900° C. for two hours.

The burned body obtained in this way was crushed in an agate mortar and a mortar, and desired powder phosphors (Examples 1 to 3 and Comparative Examples 1 to 8) were obtained.

Figure 1:
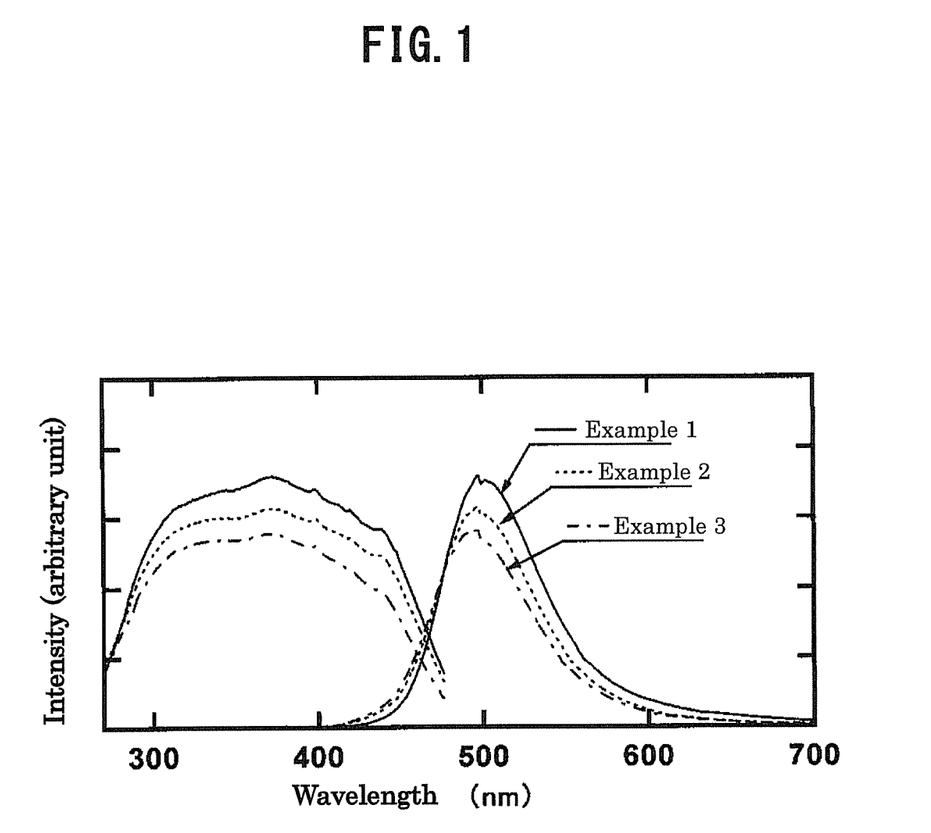
FIG. 1 is a chart showing the emission and excitation spectra of the phosphors in Examples 1 to 3.
Figure 2:
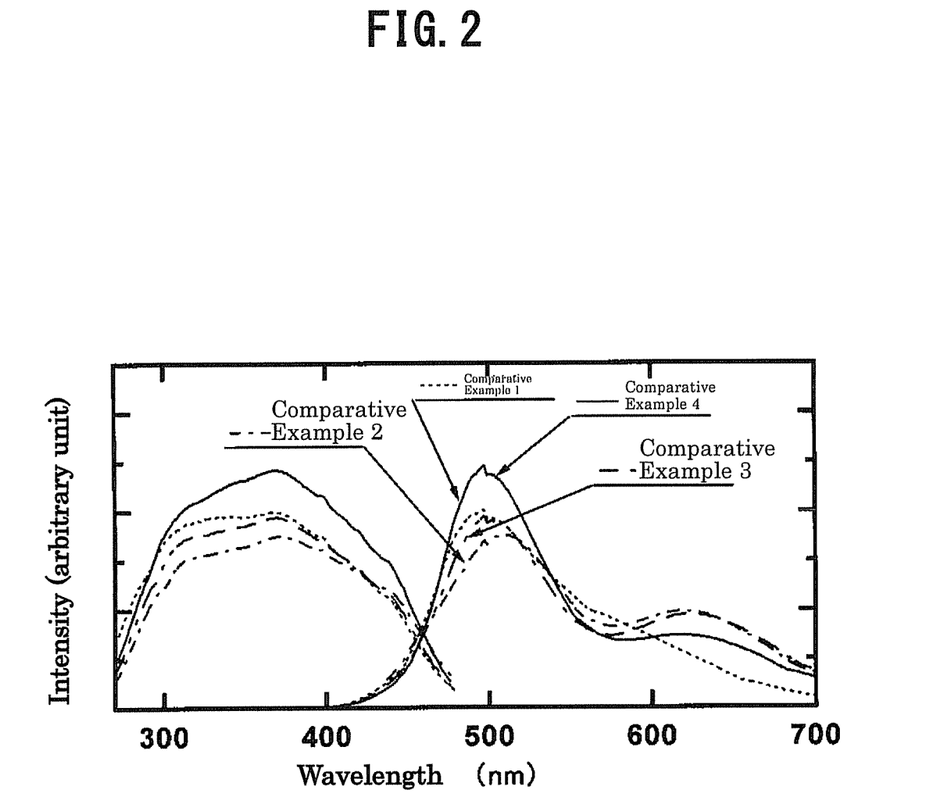
FIG. 2 is a chart showing the emission and excitation spectra of the phosphors in Comparative Examples 1 to 4.
Figure 3:
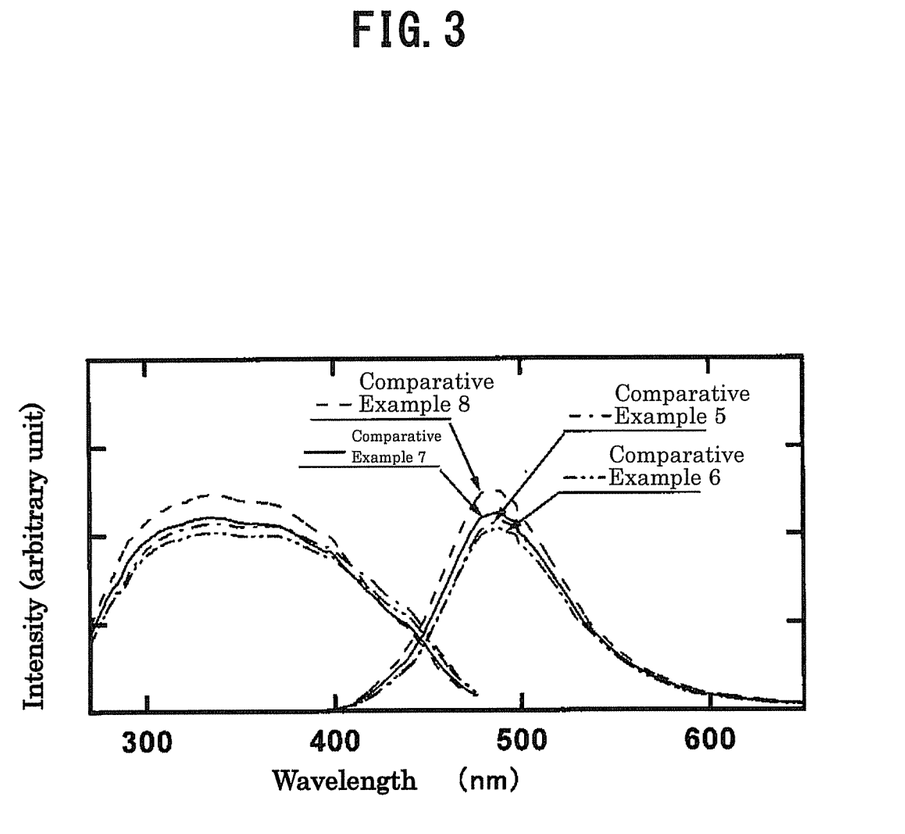
FIG. 3 is a chart showing the emission and excitation spectra of the phosphors in Comparative Examples 5 to 8.

The emission and excitation spectra of the obtained powder phosphors (Examples 1 to 3 and Comparative Example 1 to 8) were then measured using a fluorescence spectrophotometer. FIG. 1 shows the measurement results of emission and excitation spectra of Examples 1 to 3, FIG. 2 shows those of Comparative Examples 1 to 4, and FIG. 3 shows those of Comparative Examples 5 to 8. The emission spectra are measurement results obtained at excitation wavelength of 450 nm. Table 3 lists the emission peak wavelengths and emission intensity obtained from that emission spectrum as well as the above burning conditions. Since emission peak intensity varies depending on the error between measuring instruments, fluctuation of light source of the measuring instruments, and measurement conditions, it was listed in Table 3 as relative values (%) with respect to the value of the reference phosphor.

TABLE 3

| | | Burning condition | | | Emission characteristics | | |
|---|---|---|---|---|---|---|---|
| | Vessel | Burning temp. (° C.) | Time (hour) | Pressure (MPa) | Peak wavelength (nm) | Peak intensity | 2nd phase emission |
| Com. Ex. 1 | BN crucible | 1900 | 2 | 0.9 | 496 | 108 | Detected |
| Com. Ex. 2 | BN crucible | 1900 | 2 | 0.9 | 508 | 93 | Detected |
| Com. Ex. 3 | BN crucible | 1900 | 2 | 0.9 | 497 | 103 | Detected |
| Com Ex. 4 | BN crucible | 1900 | 2 | 0.9 | 497 | 130 | Detected |
| Example 1 | BN crucible | 1900 | 2 | 0.9 | 497 | 190 | Not detected |
| Example 2 | BN crucible | 1900 | 2 | 0.9 | 497 | 167 | Not detected |
| Example 3 | BN crucible | 1900 | 2 | 0.9 | 496 | 149 | Not detected |
| Com. Ex. 5 | BN crucible | 1900 | 2 | 0.9 | 488 | 114 | Detected |
| Com. Ex. 6 | BN crucible | 1900 | 2 | 0.9 | 488 | 109 | Detected |
| Com. Ex. 7 | BN crucible | 1900 | 2 | 0.9 | 488 | 119 | Detected |
| Com. Ex. 8 | BN crucible | 1900 | 2 | 0.9 | 487 | 132 | Detected |

Results derived from Tables 1 to 3 will be described in detail.

The obtained burned bodies had different emission peak wavelengths and emission intensity, depending on designed composition ratio. The emission peak wavelengths in Examples 1 to 3 of the present invention fell within the range from 495 nm to 530 nm, had uniform emission state, and had high emission intensity. Meanwhile, in Comparative Example 1, where the value of p was lower than the lower limit of the range specified in the present invention, wide emission due to second and more phases was found in the range from 550 nm to 700 nm, as shown in FIG. 2, and the emission intensity was lower than that in Examples 1 to 3. Similarly, in Comparative Examples 2 to 4, where d/c or f/e was lower than the lower limit value, emission due to second and more phases was found, and the emission intensity was low. Meanwhile, in Comparative Examples 5 to 8, where d/c or f/e value in designed composition was larger than the upper limit specified in the present invention, the emission peak wavelength was 488 nm, exhibiting a shift to shorter wavelength side, and the form of emission trailed on the short and long wavelength sides, although apparent emission from second phase did not exist, as shown in FIG. 3. The emission intensity was also lower than that in Examples 1 to 3.

Table 4 exhibits designed compositions and the analytical compositions a, b, d/c, and f/e of Examples 1 and 2 obtained by chemical analysis. All of them fell within the range specified by the present invention. The analytical composition f/e exhibited relatively higher value compared with the designed composition. f exhibits ideal oxygen ratio within the phosphor. However, since oxygen contained in crystal lattice of the phosphor, oxygen contained in raw materials and atmosphere during burning, oxygen having attached to the surface of phosphor particles via moisture in the air, etc. were all taken into calculation in the analysis, values relatively higher than the design value may be exhibited in some cases.

TABLE 4

| | Designed composition | | | | Analytical composition | | | |
|---|---|---|---|---|---|---|---|---|
| | a | b | d/c | f/e | a | b | d/c | f/e |
| Example 1 | 0.987 | 0.013 | 0.24 | 0.07 | 0.987 | 0.013 | 0.23 | 0.13 |
| Example 2 | 0.987 | 0.013 | 0.28 | 0.09 | 0.987 | 0.013 | 0.27 | 0.15 |

Figure 4:
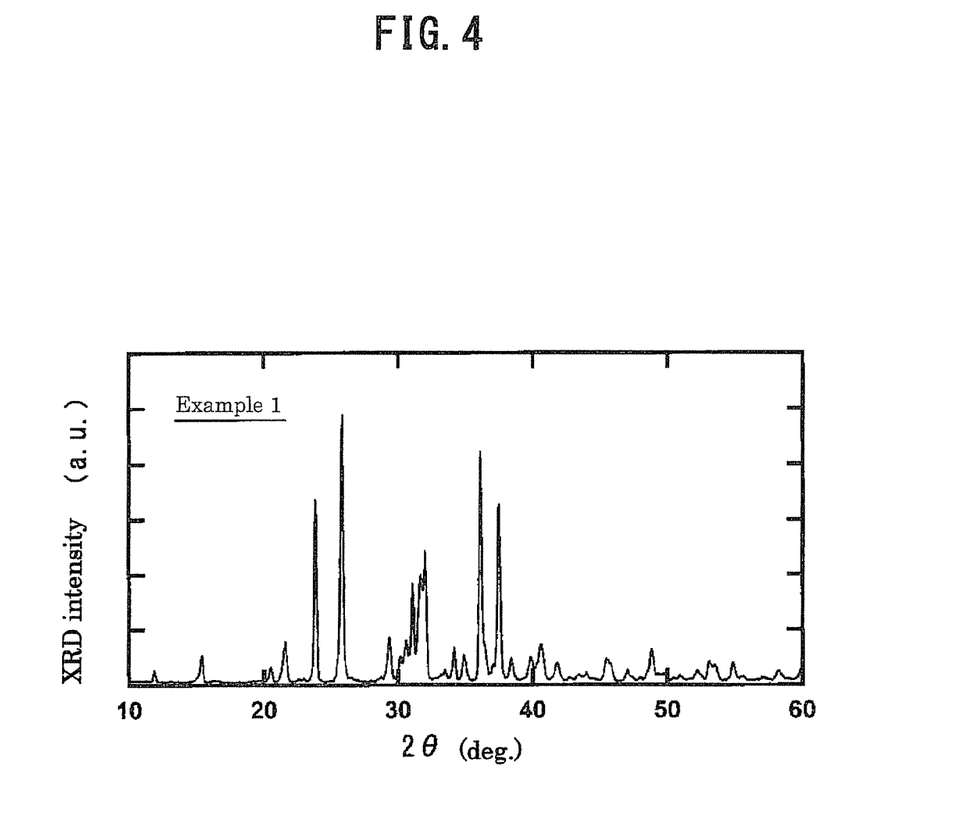
FIG. 4 is a chart showing X-ray diffraction pattern of the powder of the phosphor in Example 1 of the present invention.
Figure 5:
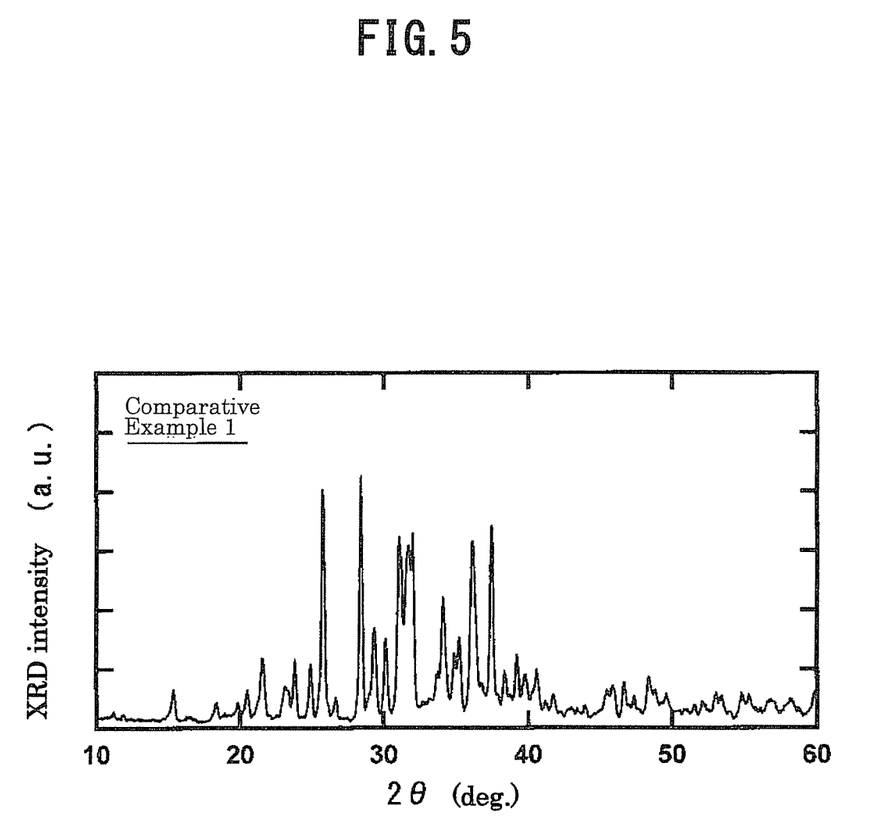
FIG. 5 is a chart showing X-ray diffraction pattern of the powder of the phosphor in Comparative Example 1.
Figure 6:
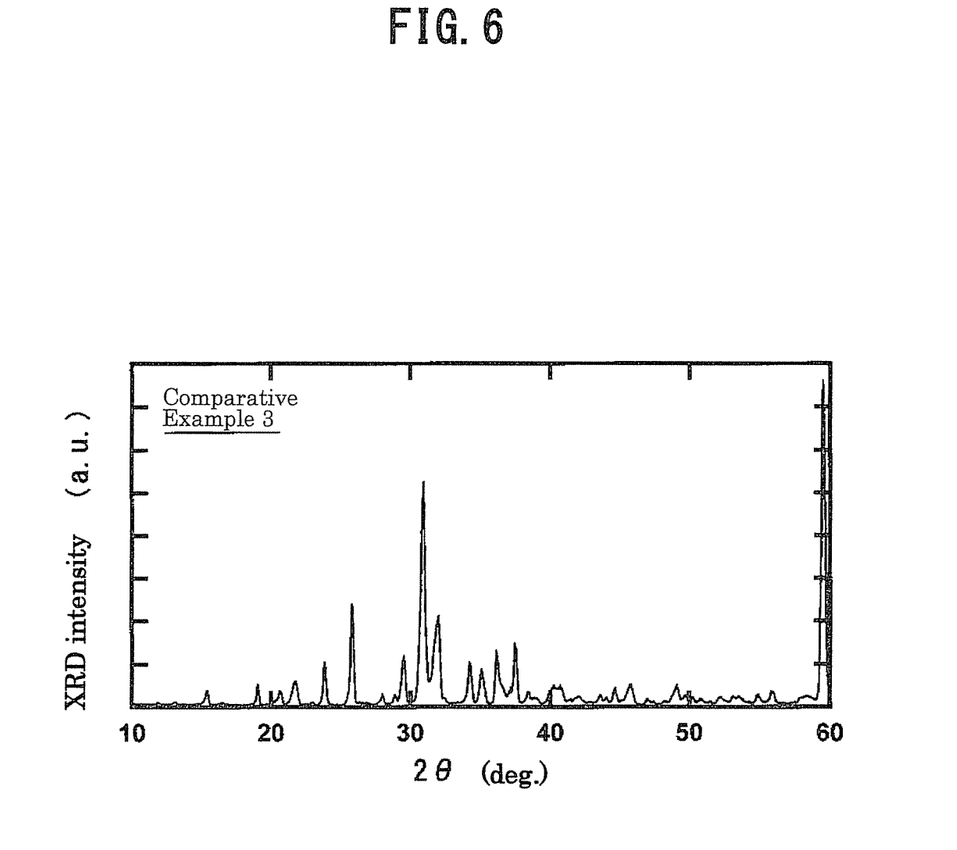
FIG. 6 is a chart showing X-ray diffraction pattern of the powder of the phosphor in Comparative Example 3.
Figure 7:
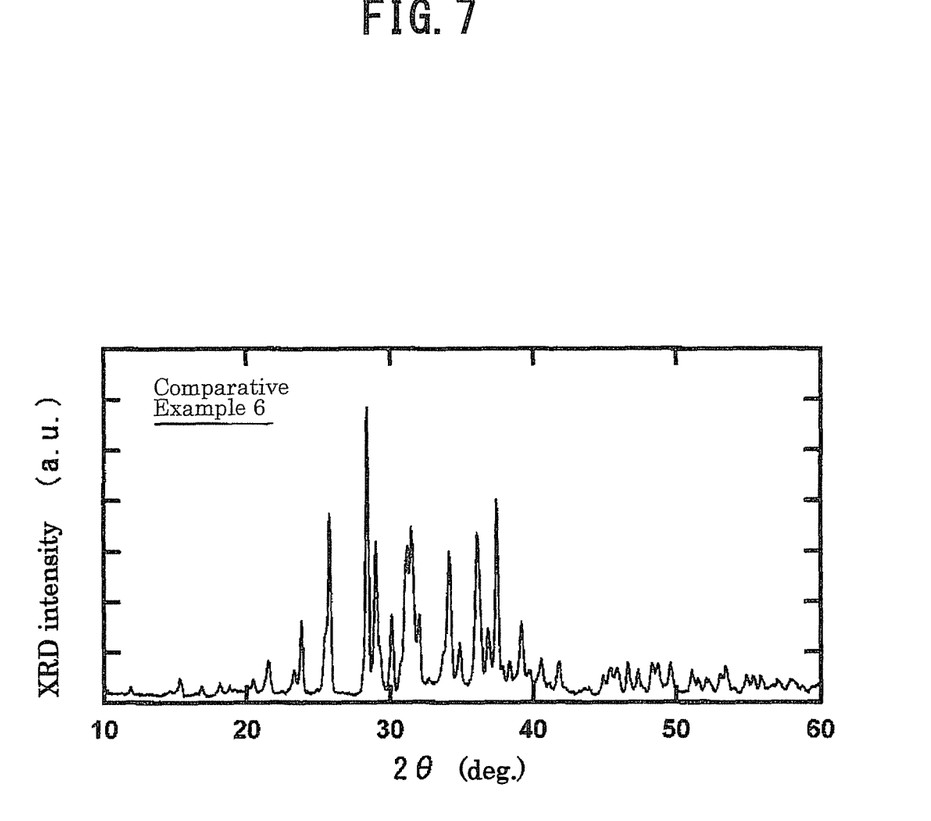
FIG. 7 is a chart showing the power X-ray diffraction pattern of the phosphor in Comparative Example 6.

FIG. 4 shows the measurement result of X-ray diffraction pattern of the phosphor powder in Example 1. FIGS. 5, 6, and 7 respectively show the X-ray diffraction pattern of the phosphors powder in Comparative Examples 1, 3, and 6. Whereas Example 1 exhibited a typical pattern of the present invention, Comparative Examples 1, 3, and 6 exhibited different patterns from that of the phosphor of the present invention.

Regarding the X-ray diffraction measurement results, Rietveld analysis was conducted according to the method in Non-patent Literature 1, with the $(Me_{1-x}Re_xM_2X)_{13}(M_2X_4)_{21}$ crystal structure as an initial model, and convergence was found. It was therefore confirmed that this crystal was described by a crystal structure model represented as $(Me_{1-x}Re_xM_2X)_m(M_2X_4)_n$, where p=1.615 (m=13, n=21, and p=n/m).

Figure 8:
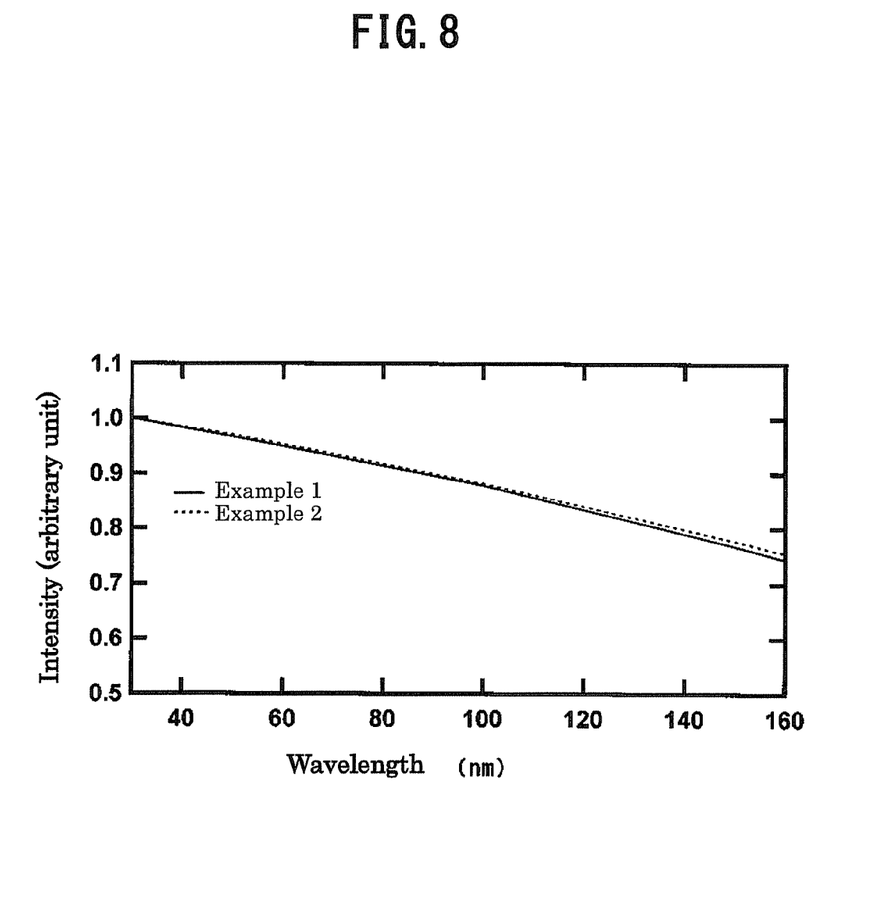
FIG. 8 is a chart showing the dependency of the emission intensity on temperature of the phosphors in Examples 1 and 2 of the present invention.

FIG. 8 shows the dependency of emission intensity on temperature in Examples 1 and 2, standardized with the temperature of 30° C. regarded as 1. The excitation wavelength was set to be 450 nm. Even if the temperature was increased to 150° C., the emission intensity remained at 0.75 (75%) or higher, meaning that quenching of these phosphors due to temperature increase was small.

With light-emitting elements adopting the power-light conversion principle, since most of the electric energy that has not contributed to emission is converted into heat, the temperature of the light-emitting element was found to be very high while it was being lit. Since the phosphor according to the present invention exhibits small decrease in emission intensity even at high temperatures, it is suitable for a light-emitting device combined with a light-emitting element.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A phosphor represented by general formula $Me_aRe_bSi_cAl_dN_eO_f$ (Me is Sr; and Re is Eu), wherein the phosphor is described by a crystal structure model represented as $(Me_{1-x}Re_xM_2X)_m(M_2X_4)_n$ (m and n are integers satisfying the relation 1.610<n/m<1.620; M is one or more elements selected from Si and Al; and X is one or more elements selected from O and N), wherein when a, b, c, d, e, and f representing composition ratio satisfy the following formulae:

$a=1-x$, $b=x$, $c=(2+2p)\times(1-y)$, $d=(2+2p)\times y$, $e=(1+4p)\times(1-z)$, and $f=(1+4p)\times z$, parameters p=n/m, x, y, and z fall within the following range:

p=1.615, x=0.013, y=0.191, 0.221 or 0.250, and z=0.062, 0.082 or 0.103, wherein the phosphor is excited by light having wavelengths falling within a range from 300 nm to 500 nm and has emission peak wavelengths falling within a range from 495 nm to 530 nm, and wherein the phosphor has no second phase.

2. A method for producing the phosphor as set forth in claim 1, comprising, a mixing process for mixing raw materials; and a burning process for burning a mixture having undergone the mixing process, wherein the raw materials are:

(1) one or more compounds selected from nitrides, carbides, hydrides, silicides, carbonates, and oxides of Sr, (2) one or more compounds selected from nitrides, hydrides, carbides, halides, and oxides of Eu, (3) one or more compounds selected from silicon nitride, silicon oxide, silicon oxynitride, and silicon metal, and (4) one or more compounds selected from aluminum nitride, aluminum oxide, aluminum oxynitride, and aluminum metal.

3. The method for producing the phosphor as set forth in claim 2, wherein the burning process is performed under ambient pressure of 0.1 MPa or higher and at temperatures falling within a range from 1600° C. to 2000° C.

4. The method for producing the phosphor as set forth in claim 2, further comprising an annealing process where the phosphor having undergone the burning process is annealed at temperatures falling within a range from 1200° C. to 1900° C.

5. The method for producing the phosphor as set forth in claim 2, wherein the raw materials in the mixing process contain the phosphor obtained in the burning process.

6. A light-emitting device comprising:
    a light-emitting element; and the phosphor as set forth in claim 1.

7. The light-emitting device as set forth in claim 6, further comprising one or more additional phosphors having emission peak wavelengths longer than those of the phosphor.

8. The light-emitting device as set forth in claim 6, wherein the light-emitting element is either inorganic or organic light-emitting element that emits light having wavelengths falling within a range from 340 nm to 500 nm.

9. The light-emitting device as set forth in claim 6 the light-emitting device is a backlight for LC TVs, light-source system for projectors, lighting system, or signaling device.

* * * * *